US012772618B2

(12) United States Patent
Miyagi

(10) Patent No.: US 12,772,618 B2
(45) Date of Patent: Oct. 20, 2026

(54) LIGHT-EMITTING ELEMENT INCLUDING SEMICONDUCTOR STRUCTURE, INSULATING FILM, ELECTRODES, AND EXTERNAL CONNECTION PORTIONS

(71) Applicant: NICHIA CORPORATION, Anan (JP)

(72) Inventor: Akihiro Miyagi, Anan (JP)

(73) Assignee: NICHIA CORPORATION, Anan (JP)

( * ) Notice: Subject to any disclaimer, the term of this patent is extended or adjusted under 35 U.S.C. 154(b) by 758 days.

(21) Appl. No.: 18/191,493

(22) Filed: Mar. 28, 2023

(65) Prior Publication Data

US 2023/0317880 A1 Oct. 5, 2023

(30) Foreign Application Priority Data

Mar. 30, 2022 (JP) ................................ 2022-055141

(51) Int. Cl.
*H10H 20/831* (2025.01)
*H10H 29/14* (2025.01)

(52) U.S. Cl.
CPC .......... *H10H 20/831* (2025.01); *H10H 29/14* (2025.01)

(58) Field of Classification Search
CPC ...... H10H 20/831; H10H 29/14; H10H 20/84; H10H 20/8316; H10H 20/8312; H10H 20/813
See application file for complete search history.

(56) References Cited

U.S. PATENT DOCUMENTS

| | | | |
|---|---|---|---|
| 2009/0212319 A1 | 8/2009 | Muraki et al. | |
| 2014/0001502 A1 | 1/2014 | Akimoto et al. | |
| 2014/0186979 A1* | 7/2014 | Tu .......................... | H01L 24/73 438/27 |
| 2018/0151780 A1 | 5/2018 | Jang et al. | |
| 2019/0097086 A1 | 3/2019 | Shichijo et al. | |
| 2019/0267529 A1 | 8/2019 | Nakai et al. | |
| 2020/0044128 A1 | 2/2020 | Miki et al. | |
| 2020/0212278 A1 | 7/2020 | Takenaga et al. | |

FOREIGN PATENT DOCUMENTS

| | | |
|---|---|---|
| CN | 114141925 A | 3/2022 |
| JP | 2014-011275 A | 1/2014 |
| JP | 2014-207267 A | 10/2014 |

(Continued)

*Primary Examiner* — Davienne N Monbleau
*Assistant Examiner* — John Patrick Cornely
(74) *Attorney, Agent, or Firm* — Foley & Lardner LLP

(57) ABSTRACT

A light-emitting element includes a semiconductor structure, which has a long side extending in a first direction and a short side extending in a second direction orthogonal to the first direction and being shorter than the long side in a top view and includes an n-layer, a p-layer, and an active layer. The n-layer includes a plurality of first regions exposed from the active layer and the p-layer, and a second region above which the active layer and the p-layer are disposed. The light-emitting element further includes a plurality of n-external connection portions, each disposed above the second region and each electrically connected to the n-electrode, and a plurality of p-external connection portions, each disposed on the p-electrode and electrically connected to the p-electrode. In a top view, the first region is disposed between the plurality of n-external connection portions and the plurality of p-external connection portions.

15 Claims, 7 Drawing Sheets

(56) References Cited

FOREIGN PATENT DOCUMENTS

| | | | |
|---|---|---|---|
| JP | 2019-062172 | A | 4/2019 |
| JP | 2019-153777 | A | 9/2019 |
| JP | 2020-021785 | A | 2/2020 |
| JP | 2020-107819 | A | 7/2020 |
| JP | 2021-097170 | A | 6/2021 |
| WO | WO-2007/145300 | A1 | 12/2007 |

* cited by examiner

LIGHT-EMITTING ELEMENT INCLUDING SEMICONDUCTOR STRUCTURE, INSULATING FILM, ELECTRODES, AND EXTERNAL CONNECTION PORTIONS

CROSS-REFERENCE TO RELATED APPLICATIONS

The present application claims priority under 35 U.S.C. § 119 to Japanese Patent Application No. 2022-055141, filed Mar. 30, 2022, the contents of which are hereby incorporated by reference in their entirety.

BACKGROUND

The present disclosure relates to a light-emitting element and a light-emitting device.

Japanese Patent Publication No. 2014-11275 proposes a light-emitting element having a rectangular shape in a top view. In the light-emitting element having the rectangular shape in a top view, a light emission distribution tends to deteriorate.

SUMMARY

An object of the present disclosure is to provide a light-emitting element and a light-emitting device having a desired light emission distribution.

According to an embodiment of the present disclosure, a light-emitting element includes a semiconductor structure, which includes a long side extending in a first direction and a short side extending in a second direction orthogonal to the first direction and being shorter than the long side in a top view and includes an n-layer, a p-layer, and an active layer located between the n-layer and the p-layer. The n-layer includes a plurality of first regions exposed from the active layer and the p-layer and a second region in which the active layer and the p-layer are disposed. The light-emitting element further includes an insulating film that covers the semiconductor structure and includes a plurality of first openings each located in the corresponding one of the plurality of first regions and a plurality of second openings each located on the p-layer above the second region, an n-electrode electrically connected to the n-layer at each of the plurality of first openings, a p-electrode electrically connected to the p-layer at each of the plurality of second openings, a plurality of n-external connection portions each disposed above the second region and each electrically connected to the n-electrode, and a plurality of p-external connection portions each disposed on the p-electrode and each electrically connected to the p-electrode. In a top view, the light-emitting element includes an n-region in which the plurality of n-external connection portions are disposed, and a p-region that is adjacent to the n-region in the first direction and in which the plurality of p-external connection portions are disposed, and, in a top view, each of the plurality of first regions is disposed between one of the plurality of n-external connection portions and another one of the plurality of n-external connection portions that are adjacent to each other, between one of the plurality of p-external connection portions and another one of the plurality of p-external connection portions that are adjacent to each other, or between one of the plurality of n-external connection portions and one of the plurality of p-external connection portions that are adjacent to each other.

The present disclosure can provide a light-emitting element and a light-emitting device having a desired light emission distribution.

DETAILED DESCRIPTION

Figure 1:
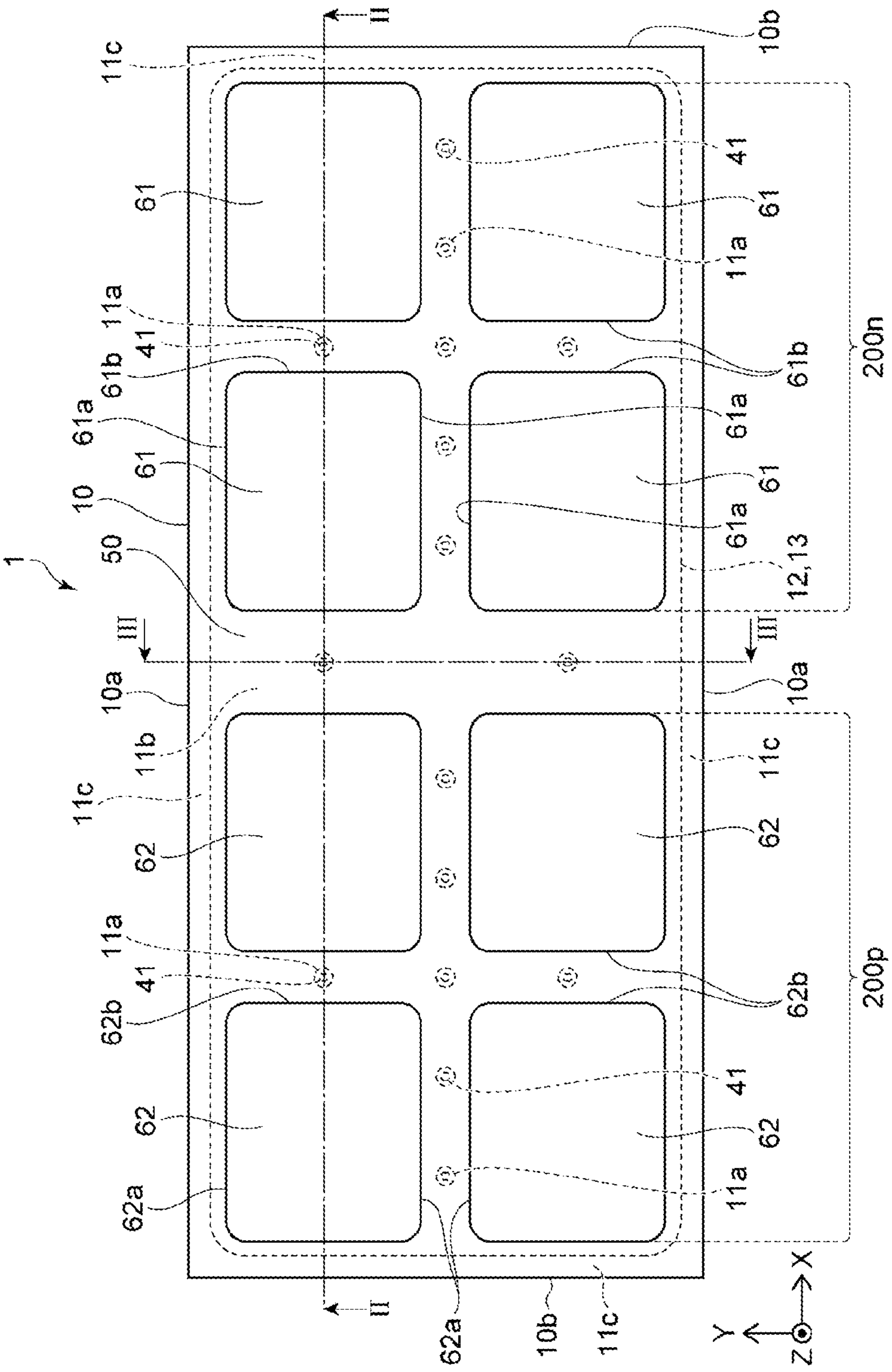
FIG. 1 is a schematic top view of a light-emitting element according to a first embodiment.

Embodiments will be described below with reference to the drawings. In the drawings, the same constituent elements are denoted using the same reference characters. Note that the drawings are diagrams that schematically illustrate embodiments, and thus scales, intervals, positional relationships, and the like of members may be exaggerated, or some of the members may not be illustrated in the drawings. As a cross-sectional view, an end view illustrating only a cut surface may be illustrated.

In the following description, components having substantially the same function may be denoted by the same reference characters and a description thereof may be omitted. Further, terms indicating a specific direction or position ("upper," "lower," and other terms including those terms) may be used. However, these terms are used merely to make it easy to understand relative directions or positions in the referenced drawing. As long as the relative direction or position is the same as that described in the referenced drawing using the term such as "upper" or "lower," in drawings other than the drawings of the present disclosure, actual products, and the like, components may not be arranged in the same manner as in the referenced drawing. In the present specification, a positional relationship expressed by the term "above" includes a case in which an object is in contact and also a case in which an object is not in contact but located above.

First Embodiment

A light-emitting element 1 according to a first embodiment includes a semiconductor structure 10. In a top view of the light-emitting element 1 illustrated in FIG. 1, two directions orthogonal to each other are referred to as a first direction X and a second direction Y. A shape of the semiconductor structure 10 in a top view is rectangular. Corner portions in this rectangle may have a right angle or may be rounded. The semiconductor structure 10 includes two long sides 10*a* extending in the first direction X and two short sides 10*b* extending in the second direction Y in a top view. A length of the short side 10*b* is shorter than a length of the long side 10*a*. For example, the length of the long side 10*a* is in a range from twice to five times the length of the short side 10*b*. The length of the long side 10*a* is, for example, in a range from 1 mm to 3 mm. The length of the short side 10*b* is, for example, in a range from 0.5 mm to 1.5 mm.

The semiconductor structure 10 is made of a nitride semiconductor. In the present description, for example, it is assumed that the "nitride semiconductor" includes a semiconductor containing all compositions having a chemical formula of $In_xAl_yGa_{1-x-y}N$ ($0 \le x \le 1$, $0 \le y \le 1$, $x+y \le 1$) provided that the composition ratios x and y are changed within the respective ranges. Further, in the chemical formula described above, it is assumed that the "nitride semiconductor" includes a semiconductor further containing a group V element other than nitrogen (N), and a semiconductor further containing various elements added to control various physical properties such as a conductivity type of a semiconductor.

Figure 2:
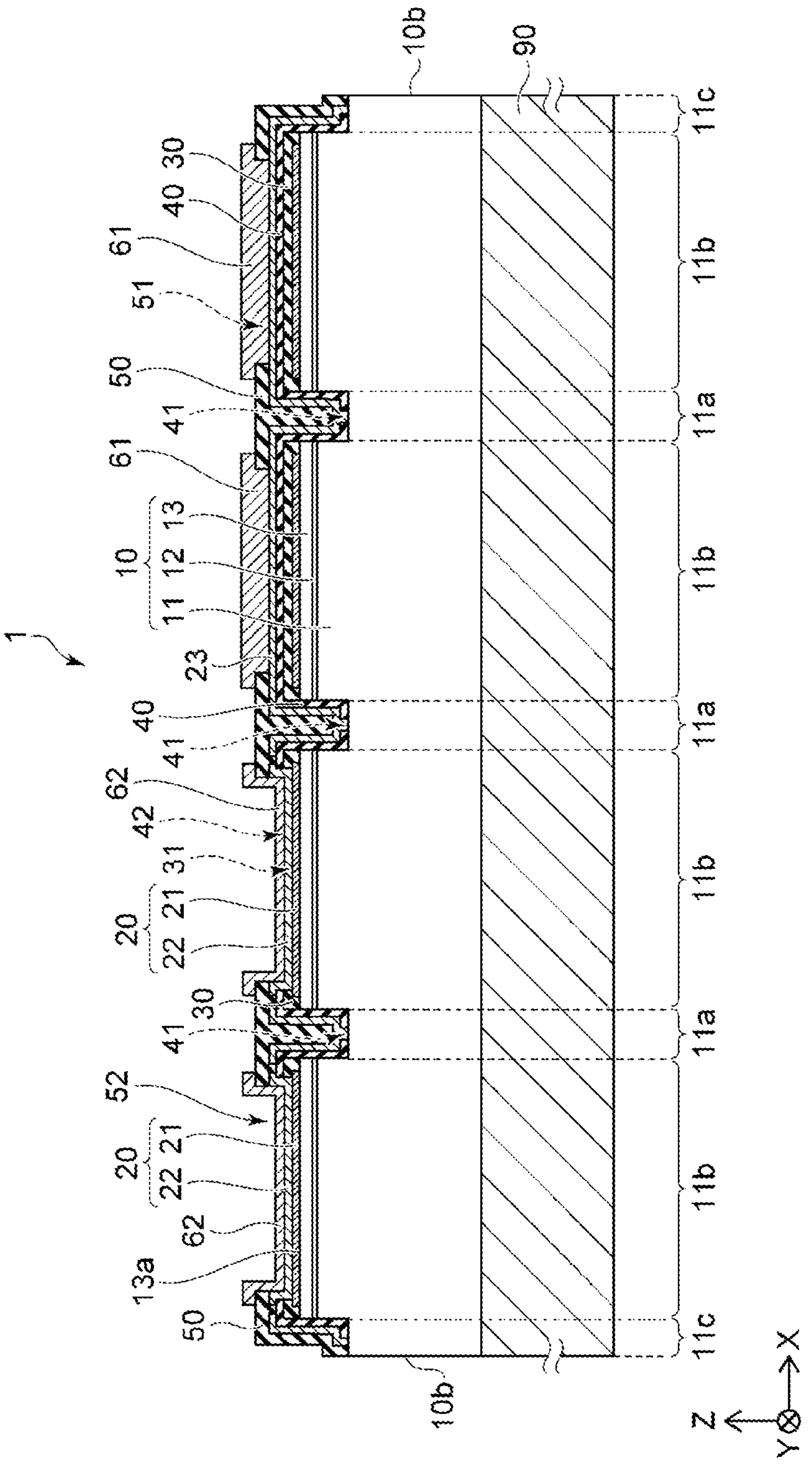
FIG. 2 is a schematic cross-sectional view taken along line II-II in FIG. 1.
Figure 3:
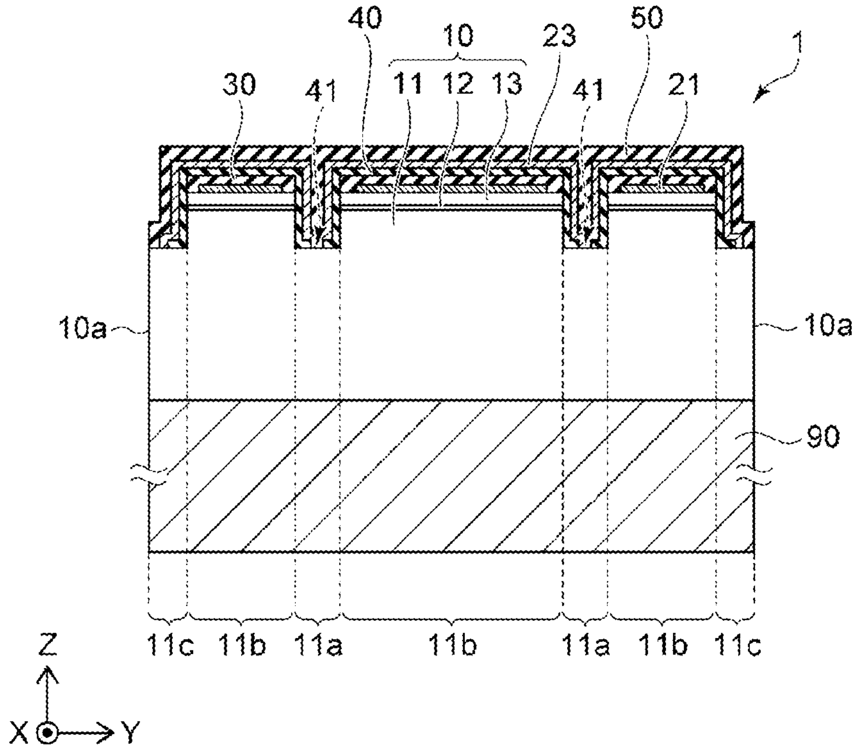
FIG. 3 is a schematic cross-sectional view taken along line III-III in FIG. 1.

As illustrated in FIG. 2, the semiconductor structure 10 includes an n-layer 11, an active layer 12, and a p-layer 13. A direction extending from the n-layer 11 to the p-layer 13 and being orthogonal to the first direction X and the second direction Y is referred to as a third direction Z. The active layer 12 is located between the n-layer 11 and the p-layer 13 in the third direction Z. The active layer 12 is a light-emitting layer that emits light and has a multiple quantum well (MQW) structure including a plurality of barrier layers and a plurality of well layers, for example. The n-layer 11 includes a semiconductor layer containing n-type impurities. The p-layer 13 includes a semiconductor layer containing p-type impurities. The active layer 12 emits light, which is ultraviolet light or visible light, for example. A light emission peak wavelength of blue light is in a range from 430 nm to 490 nm, for example. A light emission peak wavelength of green light is in a range from 500 nm to 540 nm. A light emission peak wavelength of ultraviolet light is equal to or less than 400 nm.

The n-layer 11 includes a plurality of first regions 11*a* exposed from the active layer 12 and the p-layer 13, and a second region 11*b* in which the active layer 12 and the p-layer 13 are disposed. In a top view, an area of the second region 11*b* is greater than an area of the first region 11*a*.

The semiconductor structure 10 is disposed on a substrate 90. In the third direction Z, the n-layer 11, the active layer 12, and the p-layer 13 are located in the order from a surface of the semiconductor structure 10 facing the substrate 90. For example, an insulating substrate such as sapphire or spinel can be used as the substrate 90. Furthermore, a conductive substrate such as GaN, SiC (including 6H, 4H, and 3C), ZnS, ZnO, GaAs, or Si may be used as the substrate 90. Alternatively, the light-emitting element 1 may not include the substrate 90.

The light-emitting element 1 further includes a p-electrode 20, an n-electrode 23, a covering film 30, an insulating film 40, a protective film 50, a plurality of n-external connection portions 61, and a plurality of p-external connection portions 62. The p-electrode 20 includes a first p-electrode 21 and a second p-electrode 22.

The first p-electrode 21 is disposed on an upper surface 13*a* of the p-layer 13 above the second region 11*b* and is electrically connected to the p-layer 13. The first p-electrode 21 is made of a metal material. As a material of the first p-electrode 21, for example, a metal such as silver and aluminum, or an alloy containing these metals can be used.

The covering film 30 covers the semiconductor structure 10 and the first p-electrode 21. The covering film 30 includes a plurality of sixth openings 31 located on the first p-electrode 21. The covering film 30 is, for example, a silicon oxide film or a silicon nitride film. The covering film 30 may have a single layer structure or may have a layered structure in which a plurality of insulating films are layered.

The insulating film 40 covers the semiconductor structure 10 and the covering film 30. The insulating film 40 has a plurality of first openings 41 each located in the corresponding one of first regions 11*a*, and a plurality of second openings 42 each located on the p-layer 13 above the second region 11*b*. The insulating film 40 is, for example, a silicon oxide film or a silicon nitride film. The insulating film 40 may have a single layer structure or may have a layered structure in which a plurality of insulating films are layered.

The first region 11*a* includes a portion exposed from the insulating film 40 in the first opening 41. In the example illustrated in FIG. 1, the first region 11*a* and the first opening 41 are represented by dashed circles. In a top view, the first opening 41 having a circular shape is located inside the first region 11*a* having a circular shape. Note that the shape of the first region 11*a* and the first opening 41 in a top view is not limited to circular, and may be elliptical, quadrangular, or polygonal such as pentagonal or more. Note that all the shapes of the first regions 11*a* in a top view are not limited to the same, and the first region 11*a* having a different shape in a top view may be provided. Furthermore, all the first openings 41 in a top view are not limited to having the same shape; the first opening 41 may be disposed having a different shape in a top view.

At least a part of the second opening 42 of the insulating film 40 overlaps the sixth opening 31 of the covering film 30 in a top view. The first p-electrode 21 includes a portion exposed from the covering film 30 in the sixth opening 31 and exposed from the insulating film 40 in the second opening 42 overlapping the sixth opening 31 in a top view.

A part of the n-electrode 23 is disposed on the insulating film 40 and disposed above the p-layer 13 via the insulating film 40. The n-electrode 23 is in contact with the first region 11*a* at each of the plurality of first openings 41 and is electrically connected to the p-layer 11. It is preferable that all of the shapes of the plurality of first openings 41 in a top view are the same, and all the areas in which the n-electrode 23 and the n-layer 11 are in contact with each other at the plurality of corresponding first openings 41 are the same. Note that the expression of "all the areas in which the n-electrode 23 and the n-layer 11 are in contact with each other at the plurality of corresponding first openings 41 are the same" includes a case in which each area is different in a range of approximately ±3%. Furthermore, as long as all the areas in which the n-electrode 23 and the n-layer 11 are in contact with each other at the plurality of corresponding first openings 41 are the same, some of the shapes of the plurality of first openings 41 may be different in a top view.

The second p-electrode 22 is disposed in each of the plurality of second openings 42 and is in contact with the first p-electrode 21. The second p-electrode 22 is electrically connected to the p-layer 13 via the first p-electrode 21. In the examples illustrated in FIGS. 1 and 2, the plurality of second p-electrodes 22 are separated from each other and each disposed between the corresponding one of four p-external connection portions 62 and the first p-electrode 21. The second p-electrode 22 is disposed so as not to overlap the first region 11*a* in a top view.

The n-electrode 23 and the second p-electrode 22 are made of a metal material. As a material of the n-electrode 23 and the second p-electrode 22, for example, a metal such as aluminum, copper, titanium, nickel, platinum, and tungsten, or an alloy containing these metals can be used. Each of the n-electrode 23 and the second p-electrode 22 may have a single layer structure or may have a layered structure in which a plurality of metal layers are layered.

An area in which the first p-electrode 21 is in contact with the p-layer 13 at the second region 11*b* is greater than an area in which the n-electrode 23 is in contact with the p-layer 11 at the first region 11*a*.

The protective film 50 covers the n-electrode 23 and the second p-electrodes 22. The protective film 50 has a plurality of fourth openings 51 each located on the n-electrode 23 and a plurality of fifth openings 52 each located on the corresponding one of second p-electrodes 22. The protective film 50 is, for example, a silicon oxide film or a silicon nitride film. The protective film 50 may have a single layer structure or may have a layered structure in which a plurality of insulating films are layered.

The n-electrode 23 includes a portion exposed from the protective film 50 in the fourth opening 51. The second p-electrode 22 includes a portion exposed from the protective film 50 in the fifth opening 52.

The n-external connection portion 61 is disposed above the second region 11*b* and is electrically connected to the n-electrode 23. The n-external connection portion 61 is in contact with the n-electrode 23 at the fourth opening 51. The n-external connection portion 61 is electrically connected to the n-layer 11 via the n-electrode 23.

The p-external connection portion 62 is disposed on the second p-electrode 22 and is electrically connected to the second p-electrode 22. The p-external connection portion 62 is in contact with the second p-electrode 22 at the fifth opening 52. The p-external connection portion 62 is electrically connected to the p-layer 13 via the first p-electrode 21 and the second p-electrode 22.

The n-external connection portion 61 and the p-external connection portion 62 are made of a metal material. As a material of the n-external connection portion 61 and the p-external connection portion 62, for example, a metal such as titanium, nickel, platinum, gold, and tungsten, or an alloy containing these metals can be used. Each of the n-external connection portion 61 and the p-external connection portion 62 may have a single layer structure or may have a layered structure in which a plurality of metal layers are layered.

As illustrated in FIG. 1, in a top view, the light-emitting element 1 includes an n-region 200*n* in which the plurality of n-external connection portions 61 are disposed, and a p-region 200*p* that is adjacent to the n-region 200*n* in the first direction X and in which the plurality of p-external connection portions 62 are disposed. The plurality of first regions 11*a* are disposed in each of the n-region 200*n* and the p-region 200*p*. In a top view, a distance between the first regions 11*a* disposed in the n-region 200*n* and a distance between the first regions 11*a* disposed in the p-region 200*p* are the same. Note that the distance between the first regions 11*a* disposed in the n-region 200*n* and the distance between the first regions 11*a* disposed in the p-region 200*p* are not limited to the same distance; the first regions 11*a* may be disposed such that some distances in a top view are different.

In a top view, the first region 11*a* is disposed between the plurality of n-external connection portions 61 and between the plurality of p-external connection portions 62. In other words, a connection portion between the n-electrode 23 and the n-layer 11 is disposed between the plurality of n-external connection portions 61 and between the plurality of p-external connection portions 62. In this way, unevenness in the arrangement of the connection portion between the n-electrode 23 and the n-layer 11 with respect to the rectangular light-emitting element 1 can be reduced, and unevenness in a light emission distribution can be reduced.

When the light-emitting element 1 is mounted on a substrate, a bonding member is disposed between the n-external connection portion 61 and the substrate and between the p-external connection portion 62 and the substrate. The light-emitting element 1 is disposed on the substrate by flip chip bonding, for example. In a top view, because the n-external connection portion 61 and the p-external connection portion 62 are not disposed in the first region 11*a*, a load from the bonding member is less likely to be applied to the first region 11*a* when the light-emitting element 1 is mounted on the substrate. In this way, generation of a crack in the insulating film 40 disposed in the first region 11*a*, the insulating film 40 disposed so as to cover a step between the first region 11*a* and the second region 11*b*, and the protective film 50 disposed in the first region 11*a* can be reduced. As a result, reliability of the light-emitting device can be improved.

For example, the plurality of n-external connection portions 61 are disposed side by side in the first direction X and the second direction Y, and the plurality of p-external connection portions 62 are disposed side by side in the first direction X and the second direction Y. In the example illustrated in FIG. 1, four n-external connection portions 61 are disposed side by side in the first direction X and the second direction Y in the n-region 200*n*, and four p-external connection portions 62 are disposed side by side in the first direction X and the second direction Y in the p-region 200*p*. Five or more n-external connection portions 61 may be disposed side by side in the first direction X and the second direction Yin the n-region 200*n*, and five or more p-external connection portions 62 may be disposed side by side in the first direction X and the second direction Y in the p-region 200*p*. Furthermore, in the n-region 200*n*, two or more n-external connection portions 61 may be disposed side by side only in the first direction X, or two or more n-external connection portions 61 may be disposed side by side only in the second direction Y. In the p-region 200*p*, two or more p-external connection portions 62 may be disposed side by side only in the first direction X, or two or more p-external connection portions 62 may be disposed side by side only in the second direction Y.

In a top view, the first openings 41 are preferably disposed between the n-external connection portions 61 adjacent to each other in the first direction X, between the n-external connection portions 61 adjacent to each other in the second direction Y, between the p-external connection portions 62 adjacent to each other in the first direction X, and between the p-external connection portions 62 adjacent to each other in the second direction Y. In this way, in a configuration in which the plurality of n-external connection portions 61 are disposed side by side in the first direction X and the second direction Y and the plurality of p-external connection portions 62 are disposed side by side in the first direction X and the second direction Y, unevenness in a light emission distribution can be reduced.

For example, in a top view, one n-external connection portion 61 includes a first side 61*a* extending in the first direction X and a second side 61*b* extending in the second direction Y and being shorter than the first side 61*a*. Furthermore, one p-external connection portion 62 includes a first side 62*a* extending in the first direction X and a second side 62*b* extending in the second direction Y and being shorter than the first side 62*a*. A shape of each of the n-external connection portion 61 and the p-external connection portion 62 in a top view is rectangular. In the example illustrated in FIG. 1, all the shape of the n-external connection portion 61 and the p-external connection portion 62 in a top view is the same. All the shape of the n-external connection portion 61 and the p-external connection portion 62 in a top view is not limited to the same, and the n-external connection portion 61 and/or the p-external connection portion 62 having a different shape in a top view may be provided. For example, a length of each of the first sides 61*a* and 62*a* is in a range from 10% to 30% of the length of the long side 10*a*. For example, the length of each of the first sides 61*a* and 62*a* is in a range from 300 μm to 600 μm. For example, a length of each of the second sides 61*b* and 62*b* is in a range from 15% to 50% of the length of the short side 10*b*. For example, the length of each of the second sides 61*b* and 62*b* is in a range from 200 μm to 500 μm.

When areas of the plurality of first openings 41 are the same in a top view, a quantity of the first openings 41 disposed between a first side 61*a* of one of the n-external connection portions 61 and a first side 61*a* of another one of the n-external connection portions 61 that face each other is preferably greater than a quantity of the first openings 41 disposed between a second side 61*b* of one the n-external connection portions 61 and a second side 61*b* of another one the n-external connection portions 61 that face each other. Similarly, when areas of the plurality of first openings 41 are the same in a top view, a quantity of the first openings 41 disposed between a first side 62*a* of one of the p-external connection portions 62 and a first side 62*a* of another one of the p-external connection portions 62 that face each other is preferably greater than a quantity of the first openings 41 disposed between a second side 62*b* of one of the p-external connection portions 62 and a second side 62*b* of another one of the p-external connection portions 62 that face each other. In this way, in a configuration in which the plurality of n-external connection portions 61 including the first side 61*a* longer than the second side 61*b* and the plurality of p-external connection portions 62 including the first side 62*a* longer than the second side 62*b* are disposed, unevenness in a light emission distribution can be reduced. In the example illustrated in FIG. 1, two first openings 41 are disposed between a first side 61*a* of one of the n-external connection portions 61 and a first side 61*a* of another one of the n-external connection portions 61 that face each other, and one first opening 41 is disposed between a second sides 61*b* of one of the n-external connection portions 61 and a second sides 61*b* of another one of the n-external connection portions 61 that face each other. Furthermore, two first openings 41 are disposed between a first side 62*a* of one of the p-external connection portions 62 and a first side 62*a* of another one of the p-external connection portions 62 that face each other, and one first opening 41 is disposed between a second side 62*b* of one of the p-external connection portions 62 and a second side 62*b* of another one of the p-external connection portions 62 that face each other.

Furthermore, in a top view, the first opening 41 is also preferably disposed between the n-external connection portion 61 and the p-external connection portion 62. In this way, unevenness in a light emission distribution can be further reduced. In the example illustrated in FIG. 1, one first opening 41 is disposed between an n-external connection portion 61 and a p-external connection portion 62 adjacent to each other in the first direction X. In a top view, two first openings 41 are disposed between the n-region 200*n* and the p-region 200*p*.

In a top view, a shortest distance between the n-external connection portion 61 and the p-external connection portion 62 adjacent to each other is preferably longer than a shortest distance between the n-external connection portions 61 adjacent to each other and a shortest distance between the p-external connection portions 62 adjacent to each other. In this way, when the light-emitting element is bonded to the substrate by using the bonding member as described below, the possibility that the n-external connection portion 61 and the p-external connection portion 62 are electrically connected by the bonding member can be reduced. The shortest distance between the n-external connection portions 61 adjacent to each other and the shortest distance between the p-external connection portions 62 adjacent to each other are, for example, in a range from 80 μm to 120 μm. The shortest distance between the n-external connection portion 61 and the p-external connection portion 62 adjacent to each other is, for example, in a range from 100 μm to 300 μm.

Furthermore, the n-layer 11 has a third region 11*c* exposed from the active layer 12 and the p-layer 13. The third region 11*c* includes a portion exposed from the covering film 30. In a top view, the third region 11*c* extends along the long sides 10*a* and the short sides 10*b* and continuously surrounds the first regions 11*a* and the second region 11*b*. The third region 11*c* is disposed on an outer peripheral portion of the semiconductor structure 10.

The n-electrode 23 is also in contact with the n-layer 11 at the third region 11*c* in addition to the first region 11*a* and is electrically connected to the n-layer 11. In this way, unevenness in a light emission distribution can be further reduced. For example, the portion of the third region 11*c* exposed from the covering film 30 is continuously disposed on the outer peripheral portion of the semiconductor structure 10, and the connection portion between the n-electrode 23 and the n-layer 11 in the third region 11*c* continuously surrounds the first regions 11*a* and the second region 11*b*.

Second Embodiment

Figure 4:
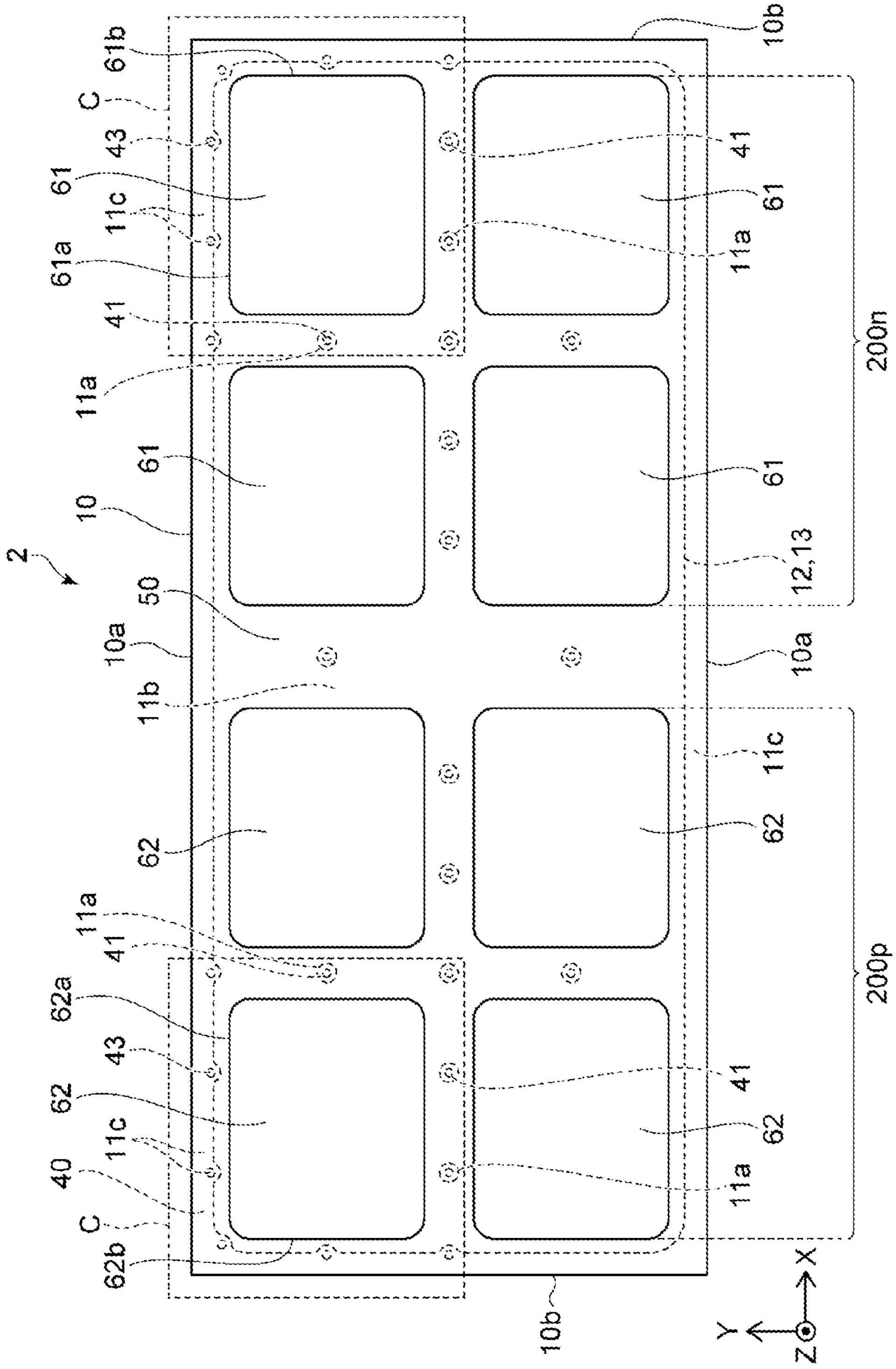
FIG. 4 is a schematic top view of a light-emitting element according to a second embodiment.

As illustrated in FIG. 4, a light-emitting element 2 according to a second embodiment basically has the same structure as that of the first embodiment described above except for that an n-electrode 23 is partially in contact with an n-layer 11 through a plurality of third openings 43 of an insulating film 40 in a third region 11*c*.

The n-layer 11 of the light-emitting element 2 has two corner portions C located away in the first direction X in a top view. Each of the corner portions C includes a part of a long side 10*a* and a part of a short side 10*b*. A length of the part of the long side 10*a* included in the corner portion C is, for example, in a range from 5% to 25% of a length of the long side 10*a*. A length of the part of the short side 10*b* included in the corner portion C is, for example, in a range from 10% to 50% of a length of the short side 10*b*.

In a top view, the insulating film 40 includes a plurality of third openings 43 located in each of the two corner portions C. In one corner portion C, the plurality of third openings 43 are disposed side by side in the first direction X and the second direction Y. In FIG. 4, the third opening 43 disposed in the corner portion C is represented by a dashed circle. A shape of the third opening 43 in a top view is not limited to circular, and may be elliptical, quadrangular, or polygonal such as pentagonal or more.

The third region 11*c* includes a portion exposed from the insulating film 40 in the third opening 43. In a portion other than the third opening 43, the third region 11*c* is covered by a covering film 30 and the insulating film 40. The n-electrode 23 is in contact with the third region 11*c* at the third opening 43 and is electrically connected to the n-layer 11. In the third region 11*c*, a portion where the third opening 43 is not disposed is covered by the insulating film 40 and is not in contact with the n-electrode 23. In the example illustrated in FIG. 4, the n-electrode 23 is electrically connected to the n-layer 11 only at the third region 11*c* located in each of the third openings 43 in the third region 11*c*.

According to the light-emitting element 2 in the second embodiment, brightness of the corner portion C including the portion where the n-electrode 23 is connected to the third region 11*c* through each of the third openings 43 can be made higher than brightness of the corner portion in which the third opening 43 is not disposed. In this way, a light-emitting element having a light emission distribution in which a part of a corner portion of the light-emitting element has higher brightness than that of another region can be achieved.

Third Embodiment

A light-emitting device including a plurality of light-emitting elements will be described as a third embodiment.

Figure 5:
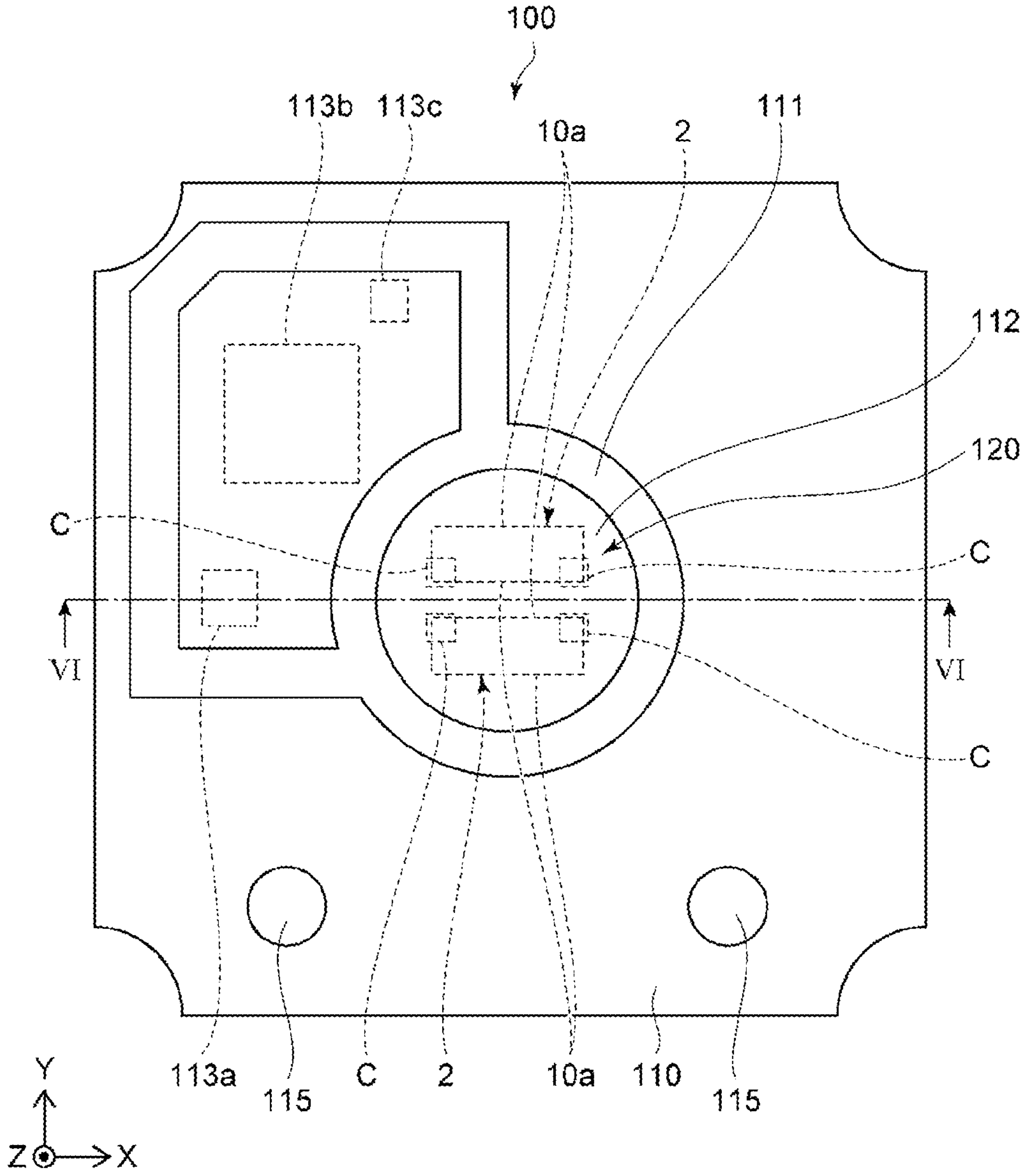
FIG. 5 is a schematic top view of a light-emitting device according to a third embodiment.
Figure 6:
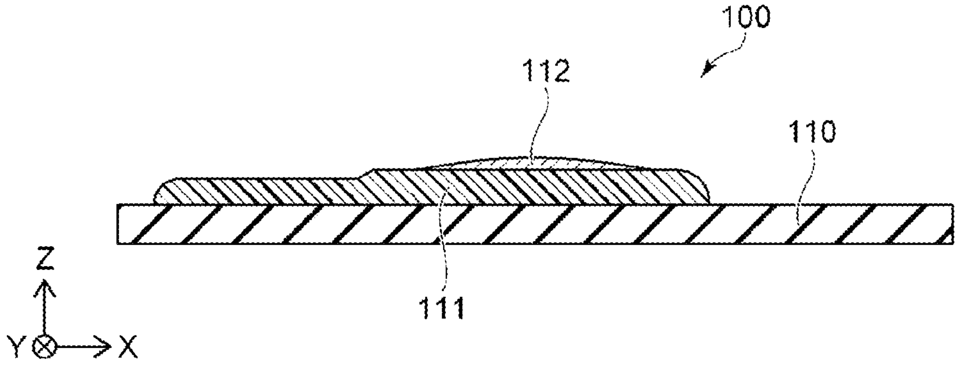
FIG. 6 is a schematic cross-sectional view taken along line VI-VI in FIG. 5.

A light-emitting device 100 illustrated in FIGS. 5 and 6 includes, as a light-emitting element, the light-emitting element 2 according to the second embodiment described above. The light-emitting device 100 includes a substrate 110 and, for example, two light-emitting elements 2 disposed on the substrate 110.

The substrate 110 is an insulating substrate, for example, a ceramic substrate or a resin substrate. A plurality of electronic components 113*a*, 113*b*, and 113*c* are also disposed on the substrate 110. The electronic components 113*a*, 113*b*, and 113*c* are, for example, a thermistor, a transistor, a rectifier diode, and the like.

In a top view, the light-emitting element 2 is surrounded by a first covering member 111. The electronic components 113*a*, 113*b*, and 113*c* are covered by the first covering member 111. In a top view, the light-emitting element 2 disposed in a region surrounded by the first covering member 111 is covered by a second covering member 112. For example, a resin material such as a phenyl silicone resin and a dimethyl silicone resin can be used for the first covering member 111 and the second covering member 112. The first covering member 111 and the second covering member 112 may include, for example, a light scattering member. As the light scattering member, titanium oxide or aluminum oxide, for example, can be used. Furthermore, the second covering member 112 may function as a lens.

The second covering member 112 can include a phosphor. Examples of the phosphor that can be used include an oxynitride based phosphor such as an yttrium aluminum garnet based phosphor (for example, $Y_3(Al,Ga)_5O_{12}$:Ce), a lutetium aluminum garnet based phosphor (for example, $Lu_3(Al,Ga)_5O_{12}$:Ce), a terbium aluminum garnet based phosphor (for example, $Tb_3(Al,Ga)_5O_{12}$:Ce), a CCA based phosphor (for example, $Ca_{10}(PO_4)_6Cl_2$:Eu), an SAE based phosphor (for example, $Sr_4Al_{14}O_{25}$:Eu), a chlorosilicate based phosphor (for example, $Ca_8MgSi_4O_{16}Cl_2$:Eu), a β-SiAlON based phosphor (for example, $(Si,Al)_3(O,N)_4$:Eu), or an α-SiAlON based phosphor (for example, $Ca(Si,Al)_{12}(O,N)_{16}$:Eu), a nitride based phosphor such as an SLA based phosphor (for example, $SrLiAl_3N_4$:Eu), a CASN based phosphor (for example, $CaAlSiN_3$:Eu), or an SCASN based phosphor (for example, $(Sr,Ca)AlSiN_3$:Eu), a fluoride based phosphor such as a KSF based phosphor (for example, $K_2SiF_6$:Mn), a KSAF based phosphor (for example, $K_2Si_{0.99}Al_{0.01}F_{5.99}$:Mn), or an MGF based phosphor (for example, $3.5MgO{\cdot}0.5MgF_2{\cdot}GeO_2$:Mn), a phosphor having a perovskite structure (for example, $CsPb(F,Cl,Br,I)_3$), or a quantum dot phosphor (for example, CdSe, InP, $AgInS_2$, or $AgInSe_2$).

A region where the second covering member 112 is disposed is referred to as a light-emitting region 120. FIG. 5 illustrates a shape of the light-emitting region 120 in a top view as circular, but the shape of the light-emitting region 120 in a top view may be elliptical, quadrangular, or polygonal such as pentagonal or more.

The light-emitting device 100 can be used for lighting mounted on a vehicle, for example. The light-emitting device 100 emits red, white, and amber colors, for example. The light-emitting device 100 that emits red color can be used for a tail lamp, a brake lamp, and the like mounted on a vehicle, for example. For example, two pin holes 115 are formed in the substrate 110. When the light-emitting device 100 is mounted into a socket or the like of automotive lighting, an external terminal of the socket is inserted into the pin hole 115. A conductor connected to a wiring pattern formed on a surface of the substrate 110 is formed on an inner peripheral surface of the pin hole 115. The external terminal inserted into the pin hole 115 comes into contact with the conductor and is electrically connected to the wiring pattern of the surface of the substrate 110. The wiring pattern is electrically connected to the light-emitting element 2 and the electronic components 113*a*, 113*b*, and 113*c*.

Two light-emitting elements 2 are disposed on the substrate 110 such that corner portions C, which include the portion where the n-electrode 23 is connected to the third region 11*c* through the third opening 43, of one of the two light-emitting elements 2 and corner portions C of the other of the two light-emitting elements 2 face each other in the second direction Y. In this way, brightness of the portion of the light-emitting region 120 where the corner portions C of one of the two light-emitting elements 2 and the corner portions C of the other of the two light-emitting elements 2 face each other can be made higher than brightness of portions of the light-emitting region 120 where the corner portions C of one of the two light-emitting elements 2 and the corner portions C of the other of the two light-emitting elements 2 do not face each other. The portions of the light-emitting region 120 where the corner portions C of one of the two light-emitting elements 2 and the corner portions C of the other of the two light-emitting elements 2 do not face each other are located on an outer periphery of the light-emitting region 120. Thus, brightness inside of the light-emitting region 120 can be made higher than brightness outside the outer periphery of the light-emitting region 120.

An n-pad and a p-pad electrically connected to the wiring pattern are disposed on the surface of the substrate 110. The plurality of (four in the example in FIG. 4) n-external connection portions 61 of each of the light-emitting elements 2 are bonded to one n-pad via a bonding member. The plurality of (four in the example in FIG. 4) p-external connection portions 62 of each of the light-emitting elements 2 are bonded to one p-pad via the bonding member. The n-pad to which the plurality of n-external connection portions 61 of one light-emitting element 2 are bonded is not divided. The p-pad to which the plurality of p-external connection portions 62 of one light-emitting element 2 are bonded is not divided. As the bonding member, solder, for example, can be used.

Figure 7A:
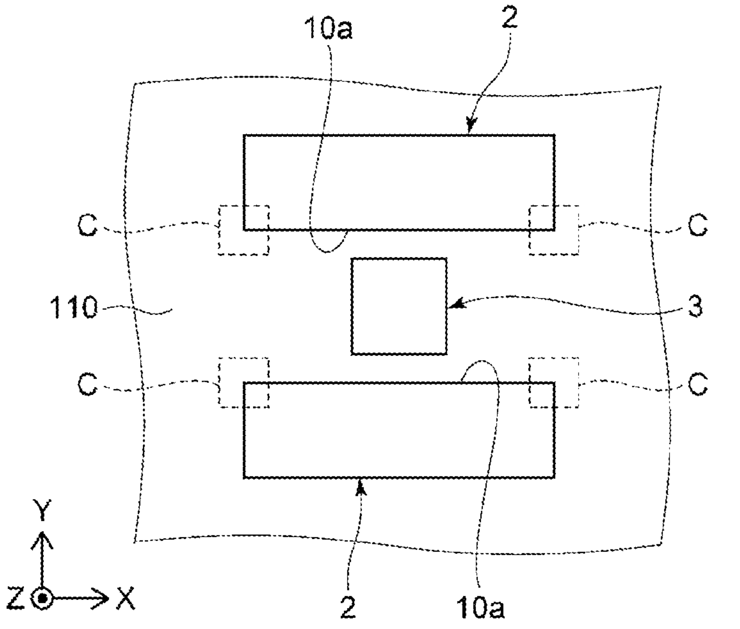
FIG. 7A is a schematic top view for illustrating an arrangement relationship between a plurality of light-emitting elements in the light-emitting device according to the third embodiment.
Figure 7B:
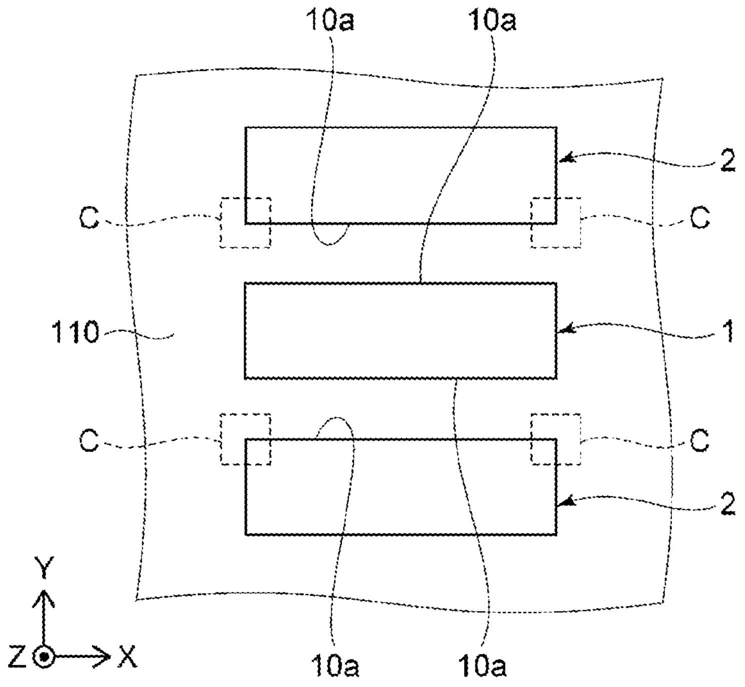
FIG. 7B is a schematic top view for illustrating an arrangement relationship between the plurality of light-emitting elements in the light-emitting device according to the third embodiment.

Three or more light-emitting elements may be disposed on the substrate 110. FIGS. 7A and 7B each illustrate an example in which three light-emitting elements are disposed on the substrate 110.

In the example illustrated in FIG. 7A, a light-emitting element 3 is disposed between two light-emitting elements 2 disposed such that the corner portions C of one of the two light-emitting elements 2 and the corner portions C of the other of the two light-emitting elements 2 face each other in the second direction Y. In a top view, a length of the light-emitting element 3 in the first direction X is shorter than a length of the light-emitting element 2 in the first direction X. The light-emitting element 3 and the two light-emitting elements 2 are connected such that light emission can be controlled individually. In this way, the light-emitting device can perform control for switching a first mode of not causing the light-emitting element 3 to emit light and causing the two light-emitting elements 2 to emit light, a second mode of not causing the two light-emitting elements 2 to emit light and causing the light-emitting element 3 to emit light, and a third mode of causing the two light-emitting elements 2 and the light-emitting element 3 to emit light. Furthermore, when each of the light-emitting elements is caused to emit light, the light-emitting element 3 may be caused to emit light at brightness lower than brightness of the light-emitting elements 2.

In the example illustrated in FIG. 7B, the light-emitting element 1 according to the first embodiment is disposed between two light-emitting elements 2 disposed such that the corner portions C of one of the two light-emitting elements 2 and the corner portions C of the other of the two light-emitting elements 2 face each other in the second direction Y. In the light-emitting element 1, the connection portion between the n-electrode 23 and the third region 11*c* of the n-layer 11 is disposed extending in the first direction X on the long side 10*a* facing the long side 10*a* of each of the light-emitting elements 2. Alternatively, a light-emitting element disposed between the two light-emitting elements 2 may be a light-emitting element including, at each of the four corner portions, the corner portion C including the portion where the n-electrode 23 is connected to the third region 11*c* through the third opening 43.

The embodiments of the present invention have been described above with reference to specific examples. However, the present invention is not limited to these specific examples. All aspects that can be practiced by a person skilled in the art modifying the design as appropriate based on the above-described embodiments of the present invention are also included in the scope of the present invention, as long as they encompass the spirit of the present invention. In addition, in the spirit of the present invention, a person skilled in the art can conceive of various modified examples and modifications, and those modified examples and modifications will also fall within the scope of the present invention.

What is claimed is:

1. A light-emitting element comprising:

a semiconductor structure having a long side extending in a first direction and a short side extending in a second direction orthogonal to the first direction and being shorter than the long side in a top view, the semiconductor structure comprising:

an n-layer, a p-layer, and an active layer located between the n-layer and the p-layer, wherein the n-layer comprises:

a plurality of first regions exposed from the active layer and the p-layer, and a second region above which the active layer and the p-layer are disposed;

an insulating film covering the semiconductor structure, and comprising:

a plurality of first openings, each located above a corresponding one of the plurality of first regions of the n-layer, and a plurality of second openings, each located above the p-layer and above the second region of the n-layer;

an n-electrode electrically connected to the n-layer at each of the plurality of first openings;

a p-electrode electrically connected to the p-layer at each of the plurality of second openings;

a plurality of n-external connection portions disposed side by side in the first direction and the second direction, each disposed above the second region and each electrically connected to the n-electrode; and a plurality of p-external connection portions disposed side by side in the first direction and the second direction, each disposed on the p-electrode and electrically connected to the p-electrode, wherein:

in the top view, the light-emitting element comprises an n-region where the plurality of n-external connection portions are disposed, and a p-region that is adjacent to the n-region in the first direction and where the plurality of p-external connection portions are disposed, in the top view, the n-region is separated from the plurality of p-external connection portions, and the p-region is separated from the plurality of n-external connection portions, and in the top view, one or more of the first openings and the corresponding one or more first regions of the n-layer are disposed (i) between two n-external connection portions adjacent to each other in the first direction of the plurality of n-external connection portions within the n-region, (ii) between two n-external connection portions adjacent to each other in the second direction of the plurality of n-external connection portions within the n-region, (iii) between two p-external connection portions adjacent to each other in the first direction of the plurality of p-external connection portions within the p-region, and/or (iv) between two p-external connection portions adjacent to each other in the second direction of the plurality of p-external connection portions within the p-region.

2. The light-emitting element according to claim 1, wherein:

in the top view, each of the plurality of n-external connection portions and the plurality of p-external connection portions has a first side extending in the first direction and a second side extending in the second direction and being shorter than the first side, in the top view, a quantity of the plurality of first openings disposed between the first side of one of the plurality of n-external connection portions and the first side of another one of the plurality of n-external connection portions that face each other is greater than a quantity of the plurality of first openings disposed between the second side of one of the plurality of n-external connection portions and the second side of another one of plurality of the n-external connection portions that face each other, in the top view, a quantity of the plurality of first openings disposed between the first side of one of the plurality of p-external connection portions and the first side of another one of the plurality of p-external connection portions that face each other is greater than a quantity of the plurality of first openings disposed between the second side of one of the plurality of p-external connection portions and the second side of another one of the plurality of p-external connection portions that face each other, and in the top view, areas of the plurality of first openings that are disposed (i) between the first side of one of the plurality of n-external connection portions and the first side of another one of the plurality of n-external connection portions that face each other, (ii) between the second side of one of the plurality of n-external connection portions and the second side of another one of the plurality of n-external connection portions that face each other, (iii) between the first side of one of the plurality of p-external connection portions and the first side of another one of the plurality of p-external connection portions that face each other, and/or (iv) between the second side of one of the plurality of p-external connection portions and the second side of another one of the plurality of p-external connection portions that face each other, are identical.

3. The light-emitting element according to claim 1, wherein:

a length of the long side is in a range from twice to five times a length of the short side.

4. The light-emitting element according to claim 2, wherein:

a length of the long side is in a range from twice to five times a length of the short side.

5. The light-emitting element according to claim 1, wherein:

in the top view, each of the plurality of first openings is disposed between one of the plurality of n-external connection portions and one of the plurality of p-external connection portions that are adjacent to each other.

6. The light-emitting element according to claim 2, wherein:

in the top view, each of the plurality of first openings is disposed between one of the plurality of n-external connection portions and one of the plurality of p-external connection portions that are adjacent to each other.

7. The light-emitting element according to claim 4, wherein:

in the top view, each of the plurality of first openings is disposed between one of the plurality of n-external connection portions and one of the plurality of p-external connection portions that are adjacent to each other.

8. The light-emitting element according to claim 1, wherein:

in the top view, the n-layer comprises first and second corner portions located away from each other in the first direction, wherein the first corner portion overlaps with the second corner portion in the first direction and does not overlap with the second corner portion in the second direction, in the top view, the n-layer comprises a third region located within each of the first and second corner portions and exposed from the active layer and the p-layer, and the n-electrode is electrically connected to the n-layer only at the third region within each of the first and second corner portions.

9. The light-emitting element according to claim 2, wherein:

in the top view, the n-layer comprises first and second corner portions located away from each other in the first direction, wherein the first corner portion overlaps with the second corner portion in the first direction and does not overlap with the second corner portion in the second direction, in the top view, the n-layer comprises a third region located within each of the first and second corner portions and exposed from the active layer and the p-layer, and the n-electrode is electrically connected to the n-layer only at the third region within each of the first and second corner portions.

10. The light-emitting element according to claim 4, wherein:

in the top view, the n-layer comprises first and second corner portions located away from each other in the first direction, wherein the first corner portion overlaps with the second corner portion in the first direction and does not overlap with the second corner portion in the second direction, in the top view, the n-layer comprises a third region located within each of the first and second corner portions and exposed from the active layer and the p-layer, and the n-electrode is electrically connected to the n-layer only at the third region within each of the first and second corner portions.

11. A light-emitting device comprising:

a substrate; and two light-emitting elements according to claim 8 disposed on the substrate, wherein the two light-emitting elements are disposed on the substrate with the two corner portions of one of the two light-emitting elements where the third region is disposed and the two corner portions of the other of the two light-emitting elements where the third region is disposed facing each other in the second direction.

12. A light-emitting device comprising:

a substrate; and two light-emitting elements according to claim 9 disposed on the substrate, wherein the two light-emitting elements are disposed on the substrate with the two corner portions of one of the two light-emitting elements where the third region is disposed and the two corner portions of the other of the two light-emitting elements where the third region is disposed facing each other in the second direction.

13. The light-emitting element according to claim 8, wherein, in the top view, none of the first and third regions overlap with the plurality of n-external connection portions and the plurality of p-external connection portions.

14. A light-emitting element comprising:

a semiconductor structure having a long side extending in a first direction and a short side extending in a second direction orthogonal to the first direction and being shorter than the long side in a top view, the semiconductor structure comprising:

an n-layer, a p-layer, and an active layer located between the n-layer and the p-layer, wherein the n-layer comprises:

a plurality of first regions exposed from the active layer and the p-layer, and a second region above which the active layer and the p-layer are disposed;

an insulating film covering the semiconductor structure, and comprising:

a plurality of first openings, each located above a corresponding one of the plurality of first regions of the n-layer, and a plurality of second openings, each located above the p-layer and above the second region of the n-layer;

an n-electrode electrically connected to the n-layer at each of the plurality of first openings;

a p-electrode electrically connected to the p-layer at each of the plurality of second openings;

a plurality of n-external connection portions, each disposed above the second region and each electrically connected to the n-electrode; and a plurality of p-external connection portions, each disposed on the p-electrode and electrically connected to the p-electrode, wherein:

in the top view, the light-emitting element comprises an n-region where the plurality of n-external connection portions are disposed, and a p-region that is adjacent to the n-region in the first direction and where the plurality of p-external connection portions are disposed, in the top view, one or more of the plurality of first regions of the n-layer are disposed (i) between one of the plurality of n-external connection portions and another one of the plurality of n-external connection portions that are adjacent to each other, (ii) between one of the plurality of p-external connection portions and another one of the plurality of p-external connection portions that are adjacent to each other, and/or (iii) between one of the plurality of n-external connection portions and one of the plurality of p-external connection portions that are adjacent to each other, in the top view, the n-layer comprises first and second corner portions located away from each other in the first direction, in the top view, the n-layer comprises a third region located within each of the first and second corner portions and exposed from the active layer and the p-layer, the n-electrode is electrically connected to the n-layer at the third region within each of the first and second corner portions, and in the top view, none of the first and third regions overlap with the plurality of n-external connection portions and the plurality of p-external connection portions.

15. The light-emitting element according to claim 14, wherein:

the first corner portion overlaps with the second corner portion in the first direction and does not overlap with the second corner portion in the second direction, and the n-electrode is electrically connected to the n-layer only at the third region within each of the first and second corner portions.

* * * * *